United States Patent
Inaba

(10) Patent No.: US 6,897,481 B2
(45) Date of Patent: May 24, 2005

(54) SEMICONDUCTOR DEVICES AND MANUFACTURING METHODS THEREOF

(75) Inventor: Shogo Inaba, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 441 days.

(21) Appl. No.: 10/212,651

(22) Filed: Aug. 5, 2002

(65) Prior Publication Data

US 2002/0187604 A1 Dec. 12, 2002

Related U.S. Application Data

(62) Division of application No. 09/491,760, filed on Jan. 27, 2000, now Pat. No. 6,479,342.

(30) Foreign Application Priority Data

Jan. 27, 1999  (JP) ............................................ 11-019048
Dec. 15, 1999  (JP) ............................................ 11-355889

(51) Int. Cl.[7] .............................................. H01L 21/00
(52) U.S. Cl. .......................... 257/71; 257/239; 257/296; 257/308; 257/908
(58) Field of Search ........................ 257/71, 239, 296, 257/308, 908

(56) References Cited

U.S. PATENT DOCUMENTS

| | | | | | |
|---|---|---|---|---|---|
| 5,227,323 A | * | 7/1993 | Nishitsuji et al. | ............ | 438/396 |
| 5,817,533 A | * | 10/1998 | Sen et al. | ........................ | 438/4 |
| 5,843,817 A | * | 12/1998 | Lee et al. | .................... | 438/239 |
| 6,359,295 B2 | * | 3/2002 | Lee et al. | .................... | 257/295 |

* cited by examiner

*Primary Examiner*—Matthew Smith
*Assistant Examiner*—Victor V. Yevsikov
(74) *Attorney, Agent, or Firm*—Konrad Raynes & Victor, LLP; Alan S. Raynes

(57) ABSTRACT

Embodiments include semiconductor devices and methods of manufacture, one of which includes a capacitor unit formed on a silicon substrate. The capacitor unit is divided into a plurality of capacitor subunits which are partitioned from each other by a separating insulation layer. Each of the capacitor subunits includes a first electrode layer composed of an impurity diffusion layer formed in the silicon substrate, a second electrode layer composed of a conductive polysilicon layer and a dielectric layer composed of a silicon oxide layer interposed between the first electrode layer and the second electrode layer. The respective capacitor subunits are connected in parallel to each other through a connector.

15 Claims, 10 Drawing Sheets

SEMICONDUCTOR DEVICES AND MANUFACTURING METHODS THEREOF

This is a divisional of application Ser. No. 09/491,760, filed Jan. 27, 2000; now U.S. Pat. No. 6,479,342.

TECHNICAL FIELD

The present invention relates to semiconductor devices including a capacitor unit having a large capacitance and methods of manufacturing such semiconductor devices.

BACKGROUND

Devices such as portable phones and the like, which are small in size and mainly used while being carried, have various requirements to achieve weight reduction and miniaturization. To reduce the number of parts has been examined as a means for the requirements.

Capacitors having a large capacitance, which are used in voltage increasing circuits in, for example, power supply circuits, for increasing an external power supply voltage to a high voltage of about 3–9 V, occupy a large space. Thus, they are sometimes arranged as components different from IC chips, in which a driver circuit is formed, and packaged on boards or substrates. In such a case, since the number of parts is increased, the requirements for the weight reduction and miniaturization are not satisfied and moreover a parts packaging process is made necessary, which is disadvantageous in assembling cost.

SUMMARY

One embodiment of the present invention relates to a semiconductor device, including a capacitor unit formed on a semiconductor substrate. The capacitor unit is divided into a plurality of capacitor subunits which are separated from each other by a separating layer. Each of the capacitor subunits includes a first electrode layer, a second electrode layer, and a dielectric layer interposed between the first electrode layer and the second electrode layer.

Another embodiment relates to a method of manufacturing a semiconductor device, including forming a capacitor unit on a semiconductor substrate. The capacitor unit is divided into a plurality of capacitor subunits in such a manner that first and second conductive layers are divided by a separating layer having a predetermined pattern. Each of the capacitor subunits comprises a first electrode layer, a second electrode layer, and a dielectric layer interposed between the first electrode layer and the second electrode layer.

Another embodiment relates to a method for manufacturing a semiconductor device including forming a plurality of capacitor subunits on a substrate, the subunits each including a first electrode layer, a dielectric layer, and a second electrode layer. A separating layer is formed between adjacent subunits, the separating layer including an insulating layer disposed between adjacent second electrode layers. At least a plurality of the subunits are connected together in parallel. At least one MOS transistor is formed on the substrate, the MOS transistor including at least one layer formed at the same time using the same deposition process as at least one layer of the plurality of capacitor subunits.

Still another embodiment relates to semiconductor device including a plurality of capacitor subunits on a substrate, the subunits each including a first electrode, a dielectric, and a second electrode. A separation layer is disposed between the subunits, the separation layer including a first interlayer insulating layer, a dielectric layer, and a protective layer.

BRIEF DESCRIPTION OF THE DRAWINGS

Certain embodiments of the invention are described with reference to the accompanying drawings which, for illustrative purposes, are schematic and not necessarily drawn to scale.

DETAILED DESCRIPTION

Figure 1:
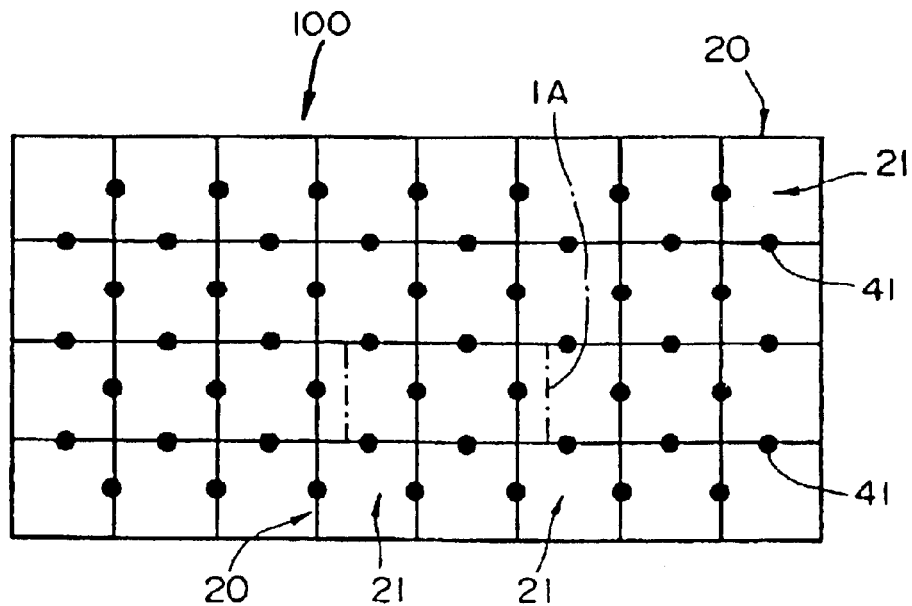
FIG. 1 is a plan view schematically showing a semiconductor device, which includes a MOS type capacitor unit, according to a first embodiment of the present invention.

Certain embodiments of the present invention relate to a semiconductor device, which is preferably applied to a capacitor and, in particular, to a capacitor having a large capacitance and a large occupying area, and a method of manufacturing the capacitor.

A semiconductor device according to one preferred embodiment of the present invention includes a capacitor unit formed on a semiconductor substrate, wherein the capacitor unit is divided into a plurality of capacitor subunits which are separated from each other by a separating layer, and each of the capacitor subunits includes a first electrode layer, a second electrode layer, and a dielectric layer interposed between the first electrode layer and the second electrode layer.

In the above-described semiconductor device, the capacitor unit is divided into a plurality of capacitor subunits having a predetermined pattern by a separating layer. The separating layer is preferably composed of a plurality of silicon oxide layers formed on the semiconductor substrate. Since the separating layer is, generally, a solid layer composed of a silicon oxide layer, the mechanical strength of the capacitor unit can be increased by the separating layer, and accordingly the external force acting on the capacitor subunits can be eased.

Since the mechanical strength of the capacitor unit can be increased by the separating layer, the semiconductor device according to certain embodiments of the present invention is particularly effective for a semiconductor device in which a pair of chips are packaged such as, for example, COB (chip on board), COG (chip on glass), COF (chip on film), TCP (tape carrier package), TAB (tape automated bonding), and the like. That is, in these packaging methods, pressure acts on them because they are jointed to a board or a substrate by crimping. Thus, the elements in the semiconductor chips are subjected to stress. This problem may be more of a concern when an element has a larger area. However, according to certain preferred embodiments of the present invention, since the stress applied to the capacitor subunits is eased by the separating layer, even if the capacitor unit has a large area, it can be reliably prevented that the capacitor subunits are broken by the stress.

The following aspects may be employed as the capacitor unit which is included in certain preferred embodiments of the present invention.

In a first aspect of certain embodiments, each of the capacitor subunits may include a first electrode layer composed of an impurity diffusion layer formed on the semiconductor substrate, a dielectric layer composed of, for example, a silicon oxide layer formed on the first electrode layer, and a second electrode layer composed of a conductive silicon layer formed on the dielectric layer.

A semiconductor device including capacitor subunits according to certain embodiments of the present invention can be easily manufactured because it can be manufactured by modifying a known process for forming a semiconductor device including a MOS transistor.

A dielectric layer may be composed of a silicon oxide layer formed using a process also used to form the gate insulating layer of a MOS transistor, and the second electrode layer may be composed of a conductive silicon layer formed using a process also used to form the gate electrode of the MOS transistor. Further, it is preferable that the separating layer for partitioning the capacitor subunits includes at least a silicon oxide layer formed by the same process as that of an element separating region. In a preferred semiconductor device, since the dielectric layer is composed of a thermal oxide layer similar to the gate insulating layer of the MOS transistor, it is thin in thickness and minute, and accordingly the capacitor unit has a large capacitance and has high reliability.

Further, in a preferred semiconductor device, it is preferable that at least one shading layer is further formed above the second electrode layer. The shading layer may be composed of a metal layer formed by the same process as that of the metal wiring layer of the semiconductor substrate including the MOS transistor. In the above structure, external light is reflected by the shading layer and does not almost reach the interior of the semiconductor device. Accordingly, it is difficult for the capacitor unit to be affected by the light in a PN junction and stable operation can be carried out for a long time.

In a second aspect of certain preferred embodiments, each of the capacitor subunits includes a first electrode layer composed of a metal layer formed above the semiconductor substrate, a dielectric layer formed on the first electrode layer, and a second electrode layer composed of a metal layer formed on the dielectric layer.

The semiconductor device including the capacitor subunits of certain embodiments can be easily manufactured because it can be manufactured by modifying a known process for forming semiconductor devices including a MOS transistor, similar to that described above.

The first electrode layer constituting each of the capacitor subunits may be composed of a metal layer which is manufactured by a process also used to form the first metal wiring layer of a semiconductor device including a MOS transistor. Further, the second electrode layer constituting each of the capacitor subunits may be composed of a metal layer which is manufactured by a process also used to form the second metal wiring layer of the semiconductor device including the MOS transistor.

A separating layer for partitioning the capacitor subunits includes at least an interlayer insulating layer interposed between the first electrode layer and the second electrode layer.

It is preferable that the dielectric layer is disposed along the surface of the opening formed in the interlayer insulating layer on the first electrode layer, and the opening is formed such that the side thereof is made to a taper shape with the diameter thereof being gradually increased toward the second electrode layer. According to the structure, since the taper is provided with the opening of the interlayer insulating layer interposed between the first electrode layer and the second electrode layer, the deterioration of step coverage can be suppressed when the dielectric layer is formed in the opening. Therefore, a short circuit between the second electrode layer and the first electrode layer in the opening of the interlayer insulating layer can be reliably prevented.

The semiconductor device of certain preferred embodiments of the present invention may include such a structure that the above capacitor unit and other circuit elements including at least the MOS transistor are mounted on the same semiconductor substrate. Since the capacitor unit can be formed by a process common to that of the semiconductor device including the MOS transistor, the capacitor unit may be formed on the same silicon substrate as that of other semiconductor circuit region such as a logic circuit and the like. When the capacitor unit and the other semiconductor circuit region are mounted on the same substrate as described above, the semiconductor device of preferred embodiments of the present invention is advantageous in a reduced packaging cost, a reduced occupying area and the like.

A preferred method of manufacturing a semiconductor device of the present invention includes the step of forming a capacitor unit on a semiconductor substrate, wherein the capacitor unit is divided into a plurality of capacitor subunits in such a manner that first and second conductive layers are divided by a separating layer having a predetermined pattern and each of the capacitor subunits includes a first electrode layer, a second electrode layer, and a dielectric layer interposed between the first electrode layer and the second electrode layer.

The preferred method of manufacturing the semiconductor device of the first aspect including the capacitor subunits includes the step of forming the first electrode layer by forming an impurity diffusion layer in a predetermined pattern on the semiconductor substrate, the step of forming a dielectric layer by forming, for example, a silicon oxide layer on the first electrode layer, and the step of forming a second electrode layer by forming a conductive silicon layer in a predetermined pattern on the dielectric layer.

Further, a preferred method of manufacturing the semiconductor device of the second aspect including the capacitor subunits includes the step of forming a first electrode layer by forming a metal layer in a predetermined pattern above the semiconductor substrate, the step of forming a dielectric layer on the first electrode layer, and the step of forming a second electrode layer by forming a metal layer in a predetermined pattern on the dielectric layer.

Certain preferred embodiments of the present invention will be described below in detail with reference to the drawings.

Figure 2:
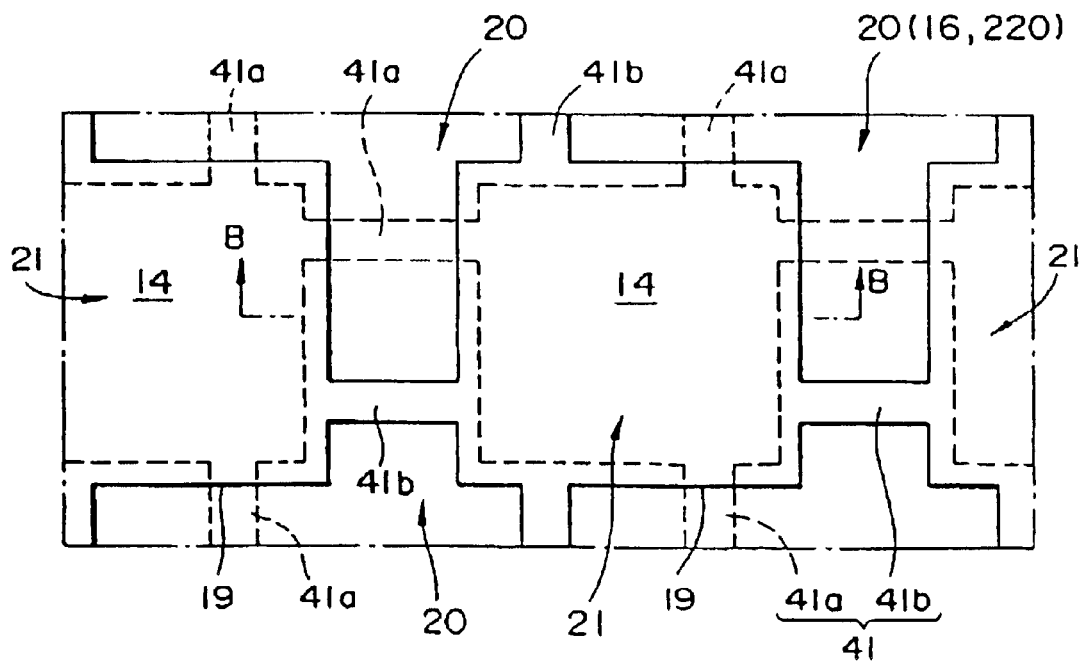
FIG. 2 is a plan view showing the region 1A shown in FIG. 1 in an enlarged fashion in which shown is a state that capacitor subunits are connected to each other.
Figure 3:
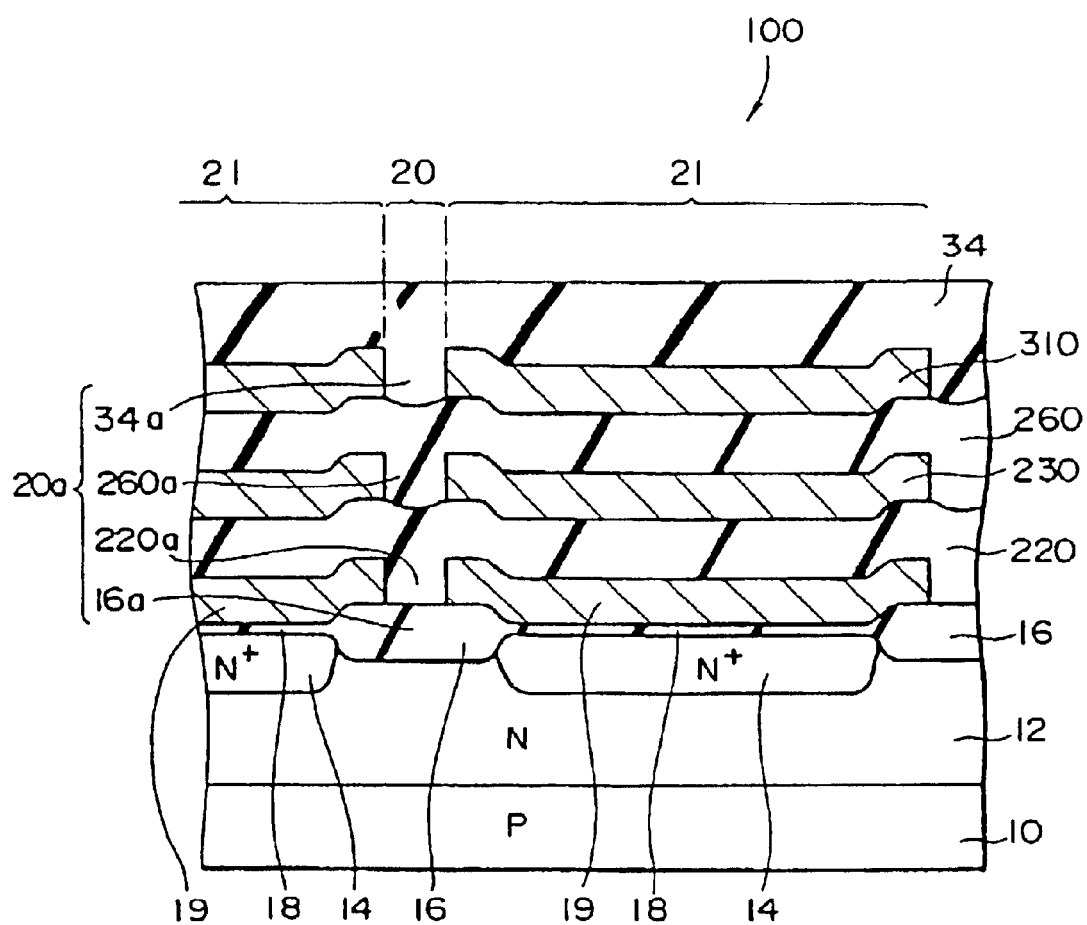
FIG. 3 is a sectional view taken along the line B—B shown in FIG. 2.

FIG. 1 is a plan view schematically showing the main portion of a semiconductor device according to a first embodiment. FIG. 2 is a plan view showing the region denoted by numeral 1A in FIG. 1 in an enlarged fashion. FIG. 3 is a sectional view showing the portion taken along the line B—B in FIG. 2.

A capacitor unit 100 which is included in a semiconductor device according to the first embodiment is divided into a plurality of capacitor subunits 21 as shown in FIG. 1. The respective capacitor subunits 21 are partitioned by a separating layer (hereinafter, it is referred to as a separating insulation layer) 20 preferably composed of an insulating layer. In the example illustrated in FIG. 1, the separating insulation layer 20 is formed in a grid shape and each capacitor subunit 21 is formed in each grid of the separating insulation layer 20. The capacitor subunit 21 is formed such that the plane shape thereof is preferably made to an approximately square shape. As shown in FIG. 2 in the enlarged fashion, it is preferred that the respective capacitor subunits 21 are connected to each other in parallel through a connection 41.

As shown in FIGS. 2 and 3, each of the capacitor subunits 21 includes a capacitor which is composed of a first electrode layer 14, a second electrode layer 19 and a dielectric layer 18 interposed between the first electrode layer 14 and the second electrode layer 19. In FIG. 2, the layers located on and above an interlayer insulating layer 220 shown in FIG. 3 are not shown.

The first electrode layer 14 is composed of, for example, an N-type high concentration impurity diffusion layer formed in the N-type well 12 in a P-type silicon substrate 10. The dielectric layer 18 is preferably composed of a silicon oxide layer formed on the first electrode layer 14 which is composed of the impurity diffusion layer. Then, the second electrode layer 19 is preferably composed of a conductive polysilicon layer formed on the dielectric layer 18.

The cross-sectional structure of the capacitor unit 100 will be described below with reference to FIG. 3.

The capacitor unit 100 is further composed of a first interlayer insulating layer 220, a first shading layer 230, a second interlayer insulating layer 260 and a second shading layer 310 which are formed on the second electrode layer 19 in this sequence. Then, a protective layer (passivation layer) 34 is formed as the uppermost layer of the capacitor unit 100. The plane shapes of the first and second shading layers 230 and 310 are formed substantially similarly to that of the second electrode layer 19.

Accordingly, the integrated separating insulation layer 20, which extends in the film thickness direction of the silicon substrate 10, is formed by an insulating layer which constitutes a LOCOS layer 16, the first interlayer insulating layer 220, the second interlayer insulating layer 260 and the protective layer 34 between the respective capacitor subunits 21. That is, adjacent capacitor subunits 21 are partitioned by a separating insulation layer 20 including the silicon oxide layer. More specifically, adjacent capacitor subunits 21 and 21 are separated from each other by a section 20a which is composed of a portion 16a of the LOCOS layer 16 continuous to the dielectric layer 18, a portion 220a of the first interlayer insulating layer 220 formed so as to cover the second electrode layer 19, a portion 260a of the second interlayer insulating layer 260 formed so as to cover the first shading layer 230 and a portion 34a of the protective layer 34 formed so as to cover the second shading layer 310.

Further, as shown in FIG. 2, the respective capacitor subunits 21 are connected to each other in parallel through the connection 41. That is, the first electrode layers 14 each composed of the impurity diffusion layer are connected to each other through a first connecting section 41a, and the second electrode layers 19 each composed of the conductive silicon layer are connected to each other through a second connecting section 41b. The first connecting section 41a is preferably composed of an impurity diffusion layer contiguous to the first electrode layer (impurity diffusion layer) 14, and the second connecting section 41b is preferably composed of a polysilicon layer contiguous to the second electrode layer (polysilicon layer).

Further, it is preferable in the first embodiment that at least one shading layer (two layers in the embodiment) is formed on and above the second electrode layer 19 as shown in FIG. 3. The shading layers 230 and 310 have a function for reflecting light which varies a capacitance in the PN junction in the silicon substrate 10 (for example, in the junction of the P-type silicon substrate 10 and the N-type well 12 in FIG. 3). That is, when light is irradiated to the PN junction, a leakage current may be generated by the occurrence of a carrier. In the embodiment, however, the occurrence of the leakage current can be prevented by the provision of the shading layers 230 and 310. A metal layer of aluminum alloy (for example, Al—Si—Cu, Al—Cu) or the like which constitutes a metal wiring layer may be used as the shading layers 230 and 310.

The capacitor unit 100 according to the first embodiment can be made on the same substrate as that of electronic elements such as a MOS transistor and the like using a process that is also used to form a semiconductor device including the MOS transistor.

The impurity diffusion layer constituting the first electrode layer 14 can be formed by introducing impurities into the well 12 by a know method using ion implantation. The silicon oxide layer constituting the dielectric layer 18 can be formed by a process also used to form the gate insulating layer of the MOS transistor. Accordingly, the dielectric layer 18 can constitute a thin layer which preferably has a film thickness of about 10 to about 100 nm, whereby the capacitance of the capacitor subunits 21 can be increased. Further, the second electrode layer 19 can be formed by a process also used to form the gate electrode of the MOS transistor. The shading layers 230 and 310 can be formed by a process also used to form the first and second metal wiring layers for the semiconductor device including the MOS transistor. Similarly, the LOCOS layer 16, the interlayer insulating layer 220 and 260 and the protective layer (passivation layer) 34 can be also formed using a process also used to form various layers in semiconductor device elements such as the MOS transistor and the like.

The materials of the respective layers constituting the capacitor unit 100 can be changed in accordance with the processes used to manufacture the other electronic elements such as the MOS transistor and the like. For example, an STI (shallow trench isolation) structure having an insulating layer buried in a trench can be used in place of the LOCOS layer 16, and a conductive layer of another material such as steel or the like can be used in place of the aluminum alloy layer. Further, the conductive type of the impurity diffusion layer constituting the first electrode layer 14 may be a P-type. In addition, the dielectric layer 18 is not limited to the silicon oxide layer and may be a dielectric layer of a silicon nitride layer, a tantalum oxide layer or the like.

The first embodiment has the following operation and effect. The capacitor unit 100 is divided into a plurality of capacitor subunits 21 having a predetermined pattern by the continuous separating insulation layer 20. Then, the separating insulation layer 20 is composed of the plurality of silicon oxide layers formed in the film thickness direction of the silicon substrate 10, specifically, of the LOCOS layer 16, the first interlayer insulating layer 220, the second interlayer insulating layer 260, and the protective layer 34. Therefore, as shown in FIG. 1, the respective capacitor subunits 21 have such a structure that the peripheries thereof are surrounded by the separating insulation layer 20 composed of the continuous silicon oxide layer. Then, since the separating insulation layer 20 is, preferably, a solid layer composed of the silicon oxide layer, the mechanical strength of the capacitor unit 100 can be increased by the separating insulation layer 20. Therefore, the external force acting on the capacitor subunits 21 can be eased.

Since the mechanical strength of the capacitor unit 100 can be increased by the separating insulation layer 20 as described above, the semiconductor device according to certain embodiments is particularly effective when it is packaged as a pair of chips such as, for example, COB, COG, COF, TCP, TAB and the like. That is, in the packaging method of them, pressure acts on semiconductor chips and the elements in the semiconductor chips are subjected to stress because they are joined to a board or a substrate by crimping. The stress may cause a problem such as distortion and the like on a metal layer of, in particular, aluminum alloy and the like. This problem may be more apparent when an element has a larger area.

However, according to the semiconductor device of the first embodiment, since the stress applied to the capacitor subunits 21 is eased by the separating insulation layer 20, even if the capacitor unit 100 has a large area, breakage of the capacitor subunits 21 due to the stress can be inhibited.

In the first embodiment, since the first and second shading layers 230 and 310 reflect light, the capacitor unit 100 is unlikely to be affected by the light even if it has a PN junction, whereby stable operation can be carried out by the capacitor unit 100 for a long time.

That is, when a capacitor has a PN junction, a carrier is liable to be caused by the light incident on the PN junction and the capacitance of the capacitor is liable to be made unstable. However, the above problem is not caused in the first embodiment because the capacitor unit 100 has the shading layers 230 and 310, each of which is preferably composed of the metal layer on and above the second electrode layer 19 and external light is reflected thereby and is thus inhibited from reaching the inside of the silicon substrate 10.

In the semiconductor device of the embodiment, since the dielectric layer 18 constituting each capacitor subunit 21 is formed by the thermal oxide layer similar to the gate insulating layer of a MOS transistor, it is thin in a film thickness. Therefore, the capacitor unit 100 has a large capacitance and is highly reliable.

In the semiconductor device of the first embodiment, since the capacitor unit 100 can be formed by a process which is also used to form a MOS transistor, the capacitor unit 100 can be formed on a silicon substrate similar to that of other semiconductor devices such as a logic circuit and the like. When the capacitor unit 100 and the other semiconductor devices are mounted on the same substrate, the semiconductor device of the embodiment is advantageous in a packaging cost, a reduced occupying area and the like.

Further, since the semiconductor device of the embodiment be manufactured using a process also used to form the other semiconductor devices such as the logic circuit and the like, it can be easily manufactured.

Furthermore, since the capacitor subunits 21 may be connected in parallel to each other through the connector 41, their capacitance can be increased.

Next, the representative results of the characteristics test of the semiconductor device according to the first embodiment will be described. Used as test samples were semiconductor devices each of which was arranged such that a first electrode layer 14 was composed of an N-type impurity diffusion layer formed by implanting phosphorous ions in an amount of $1.3 \times 10^{13}/cm^2$ with implantation energy of 100 keV, a dielectric layer 18 was a silicon oxide layer formed by thermal oxidation and a second electrode layer 19 was composed of a conductive polysilicon layer having a film thickness of about 400 nm.

The basic characteristics generally required for the capacitor unit (capacitor) include a capacitance, withstand pressure, reliability and the like.

Figure 21:
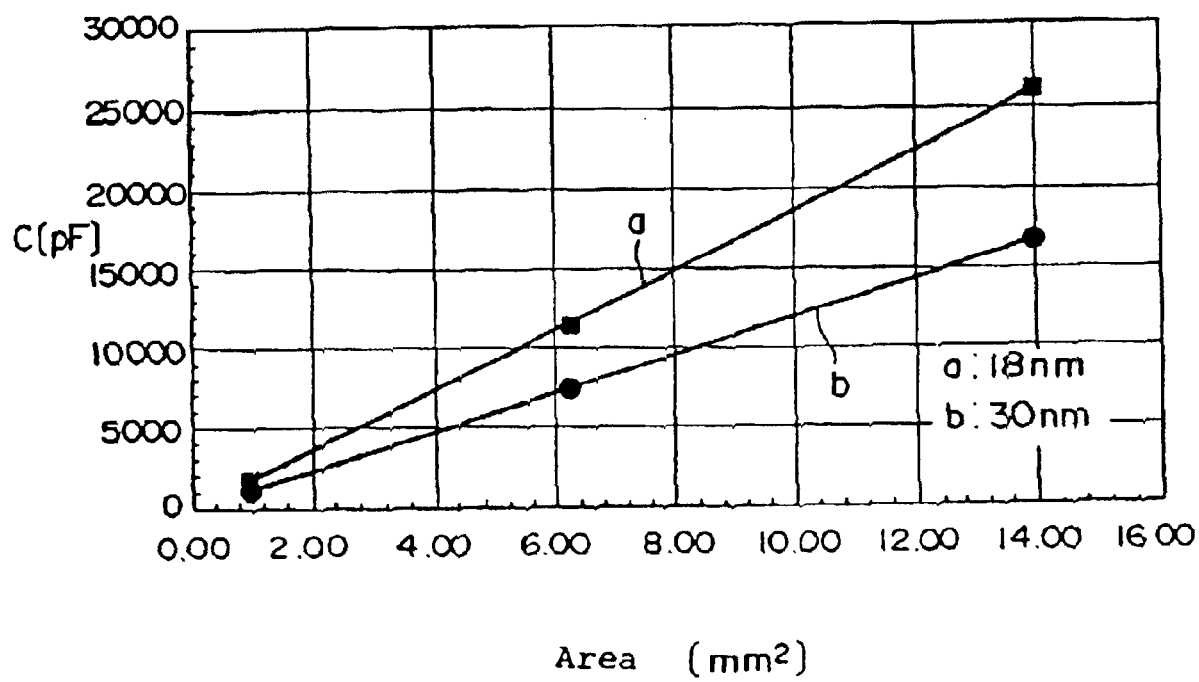
FIG. 21 is a view showing a result of a test executed to examine the capacitance of the semiconductor device according to the first embodiment of the present invention.

Three types of samples of the capacitor units each having a dielectric layer composed of a silicon oxide layer having a different area were made, a high frequency was imposed on the electrodes of the capacitor units, impedance was measured and capacitances were determined from the result of the measurement. The result of measurement is shown in FIG. 21. FIG. 21 shows the relationship between the area of the dielectric layer and the capacitance. In FIG. 21, the line shown by a symbol a shows the result of the samples in which the dielectric layer has a film thickness of 18 nm and the line shown by a symbol b shows the result of the samples in which the dielectric layer has a film thickness of 30 nm.

It is confirmed from FIG. 21 that in the samples of the embodiment, the capacitance is increased in proportion to the area of the dielectric layer.

The capacitances of samples were determined at a plurality of temperature conditions (25° C., 40° C., and 80° C.).

As a result, it is found that a degree of change of capacitance is different between a depletion state (a state in which the voltage of the first electrode layer was 0 V and the voltage of the second electrode layer was negative) and an accumulated state (a state in which the voltage of the first electrode layer was 0 V and the voltage of the second electrode layer was positive). That is, in the depletion state at the maximum at the temperatures of 25° C. and 80° C., a difference of capacitance of about 20% is found when the film thickness of the dielectric layer is 18 nm, and a difference of capacitance of about 10% is found at the maximum when the film thickness thereof is 30 nm. In contrast, in the accumulated state at the temperature of 25° and 30°, a difference of capacitance is about 0.1% even if the film thickness of the dielectric layer is any of 18 nm and 30 nm, whereby it can be confirmed that there is substantial temperature dependence in this state.

Figure 22:
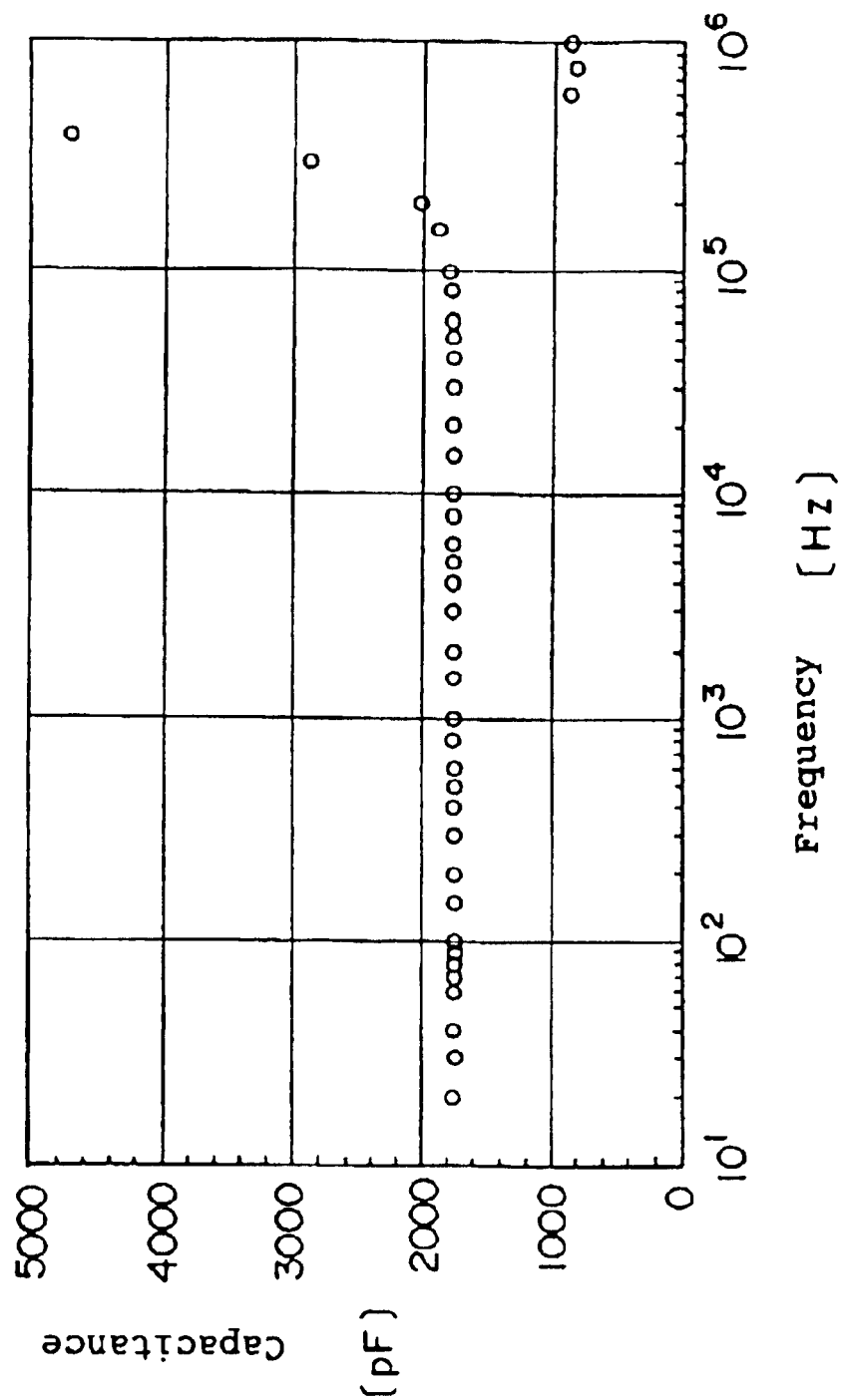
FIG. 22 is a view showing a result of a test executed to examine the relationship between the capacitance and the frequency of the semiconductor device according to the first embodiment of the present invention.

The capacitances of samples were determined under a plurality of frequency conditions. The dielectric layer of the samples used in the test had a film thickness of 18 nm. As a result, it is confirmed that there is substantially no frequency dependency in the accumulated state. This is shown in FIG. 22. In FIG. 22, the abscissa shows frequency and the ordinate shows capacitance. It can be confirmed from FIG. 22 that, in the samples of the embodiment, the capacitance is nearly unchanged in the range of about 20 Hz–about 100 kHz and is constant regardless of frequency.

Figure 23:
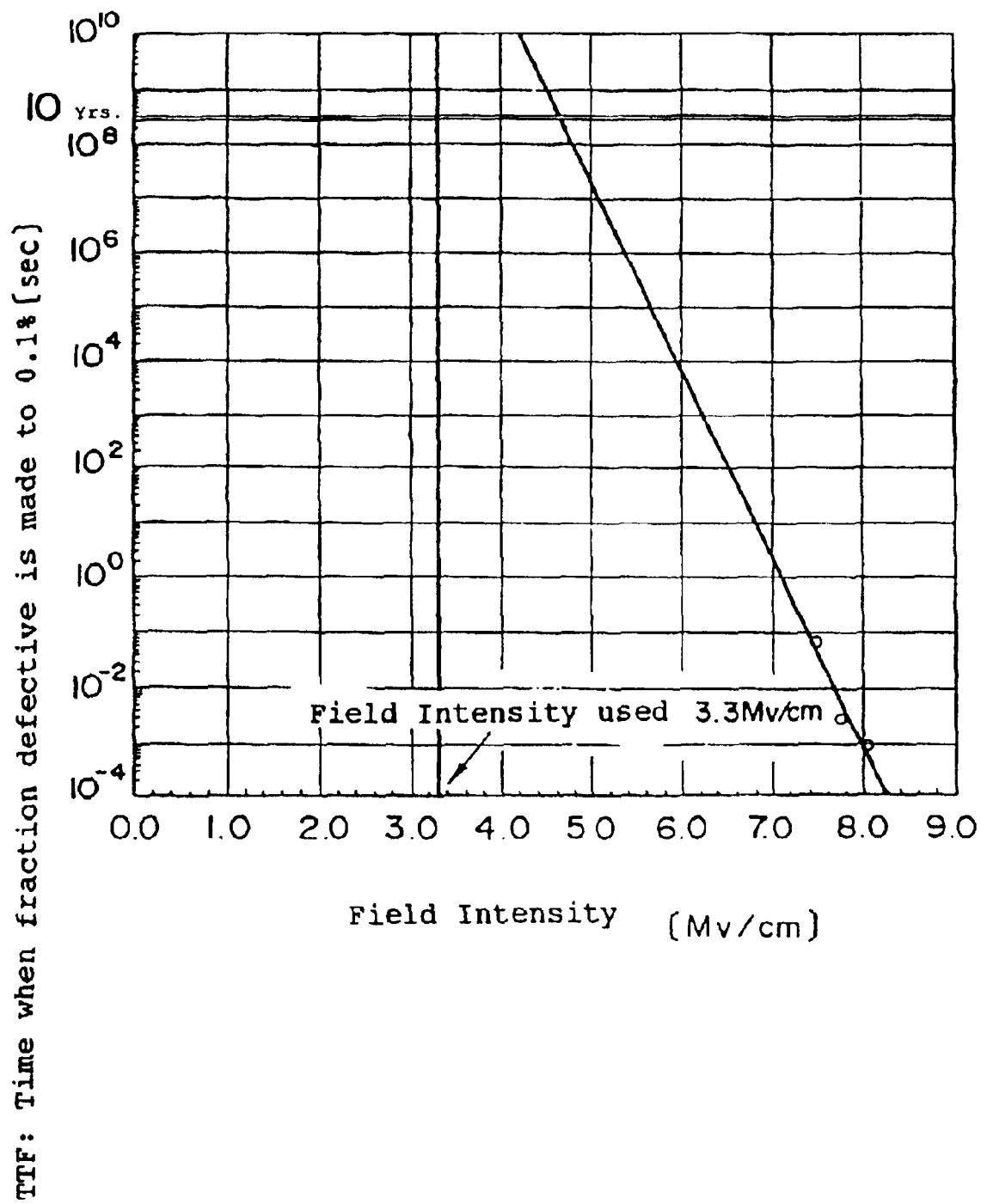
FIG. 23 is a view showing a result of a test executed to examine the relationship between the field intensity and the time, when 0.1% of fraction defective is caused, of the semiconductor device according to the first embodiment of the present invention.

TDDB (time dependent dielectric breakdown) does not mean the initial failure of a dielectric layer but means dielectric breakdown which is caused after a certain period of time passes in a state that a voltage is imposed on the dielectric layer. The life of the dielectric layer when it is used in a certain state can be estimated by the test. In the test, the time (TTF: time to failure) when failure of 0.1% was caused in the dielectric layer was determined by imposing a plurality of voltages thereon in the accumulated state. This is shown in FIG. 23. In the example of the experiment, the film thickness of the dielectric layer was set to about 18 nm and a measuring temperature was set to 70°. In FIG. 23, the abscissa shows stress electric field and the ordinate shows time (TTF) when failure of 0.1% is caused. It is confirmed from FIG. 23 that, in the semiconductor device of the embodiment, when a field intensity being used is set to, for example, 3.3 MV/cm, the fraction defective of the dielectric layer is less than 0.1% for at least 10 years.

As described above, it is confirmed from these tests that, according to the semiconductor device of the embodiment, a sufficient capacitance can be obtained and moreover good results can be obtained in the various characteristics such as the temperature dependency, frequency dependency, TDDB and the like.

Figure 4:
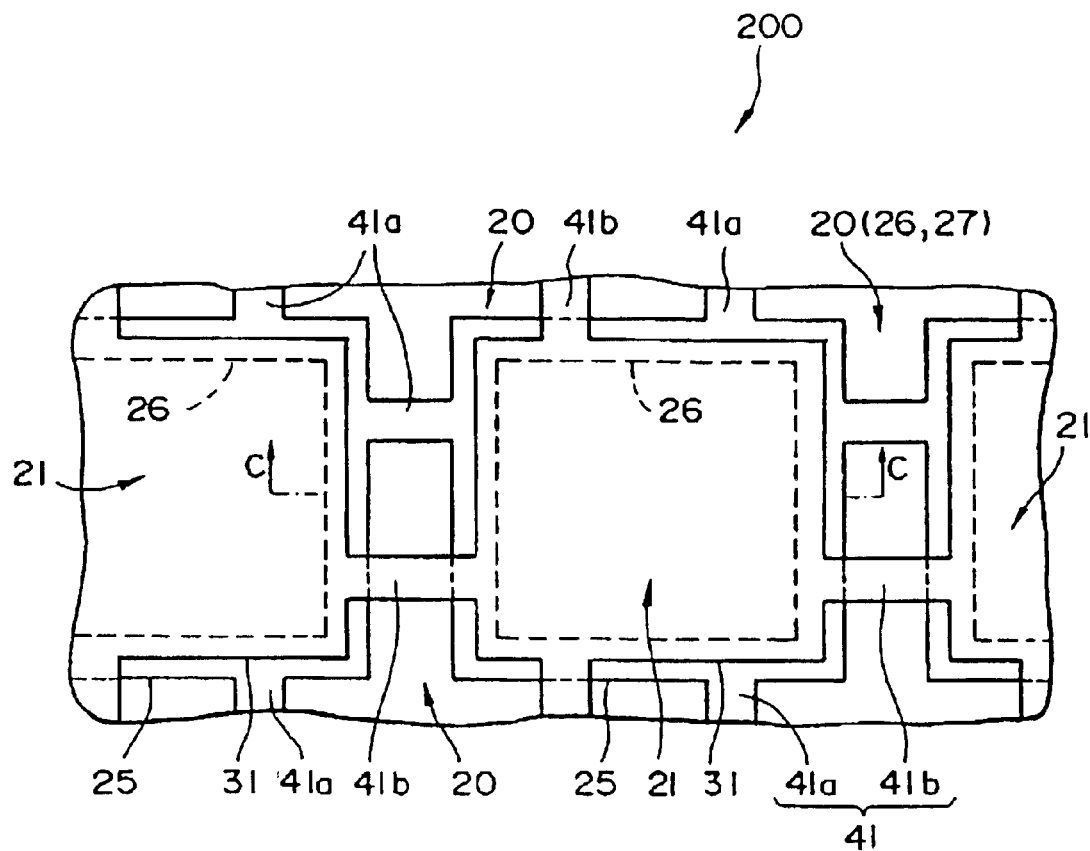
FIG. 4 is a plan view schematically showing a semiconductor device, which includes a MIM type capacitor unit, according to a second embodiment of the present invention.
Figure 5:
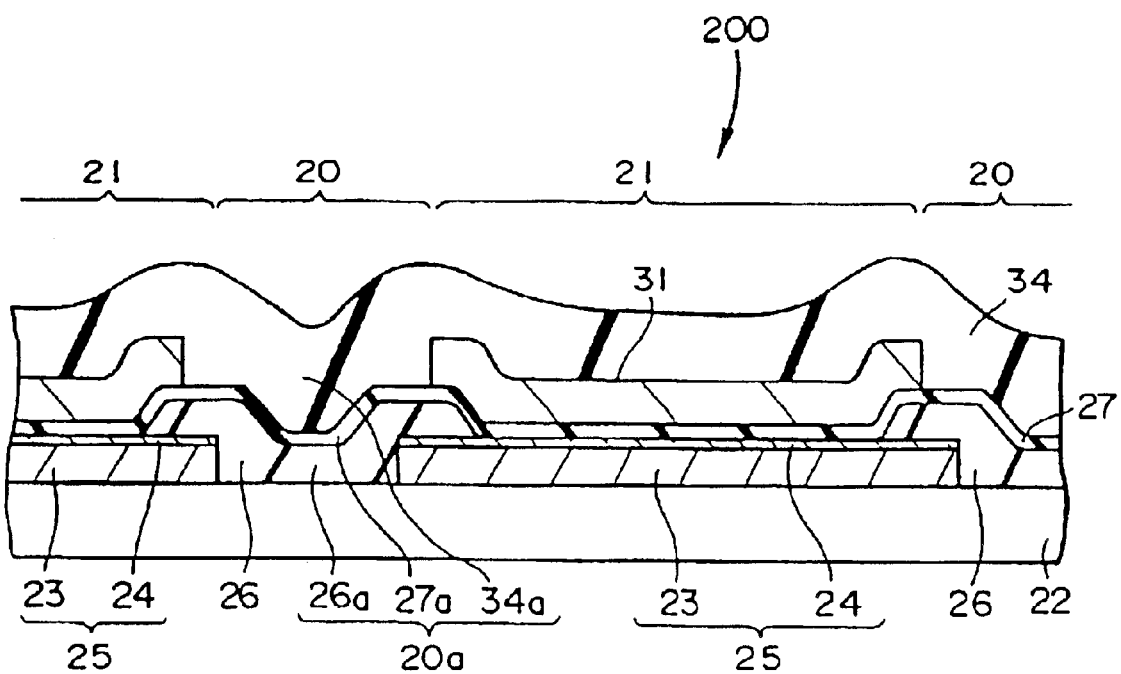
FIG. 5 is a sectional view taken along the line C—C shown in FIG. 4.

FIG. 4 is a plan view schematically showing the main portion of a semiconductor device according to a second embodiment in an enlarged fashion, and FIG. 5 is a sectional view of a portion taken along the line C—C in FIG. 4. FIG. 4 for the second embodiment corresponds to the view of FIG. 2 of the first embodiment.

A capacitor unit 200, which is included in the semiconductor device according to the embodiment, is divided into a plurality of capacitor subunits 21 as shown in FIG. 1, similar to the first embodiment. The respective capacitor subunits 21 are partitioned by a separating layer (hereinafter, referred to as a separating insulation layer) 20 composed of an insulating layer. In the example, the separating insulation layer 20 is formed in a grid shape and each capacitor subunit 21 is formed in each grid of the separating insulation layer 20. The capacitor subunit 21 is formed such that the plane shape thereof is made to a square shape. As shown in FIG. 4, the respective capacitor subunits 21 are connected to each other in parallel through a connector 41.

As shown in FIGS. 4 and 5, the capacitor subunit 21 includes a capacitor which is composed of a first electrode layer 25, a second electrode layer 31 and a dielectric layer 27 interposed between the first electrode layer 25 and the second electrode layer 31. The protective layer (passivation layer) 34 shown in FIG. 5 is not shown in FIG. 4.

The first electrode layer 25 is composed of a conductive layer formed on a first interlayer insulating layer 22 composed of a silicon oxide layer. The dielectric layer 27 is composed of a silicon oxide layer formed on the first electrode layer 25. Then, the second electrode layer 31 is composed of a metal layer formed on the dielectric layer 27. The first electrode layer 25 is preferably composed of a metal layer 23, which preferably comprises a titanium layer, a titanium nitride layer, aluminum alloy or the like, and a titanium nitride layer 24. The titanium layer and the titanium nitride layer act as a barrier for preventing the movement of a material from a material from the interlayer insulating layer 22 to the metal layer 23 so that a spike phenomenon can be prevented. Further, the titanium nitride layer 24 on the metal layer 23 acts as a reflection preventing film in a photolithography process. The above layer structure can be also employed in the shading layers 230 and 310 of the first embodiment.

The cross-sectional structure of the capacitor unit 200 will be described below with reference to FIG. 5.

The capacitor unit 200 is arranged such that the first electrode layer 25, a second interlayer insulating layer 26, the dielectric layer 27, the second electrode layer 31 and the protective layer 34 are formed on the first interlayer insulating layer 22.

The integrated separating insulation layer 20, which extends in the film thickness direction of a silicon substrate, is formed between the capacitor subunits 21 by an insulating layer which constitutes at least the second interlayer insulating layer 26 and the protective layer 34. That is, adjacent capacitor subunits 21 are partitioned by the separating insulation layer 20 composed of the silicon oxide layer. More specifically, adjacent capacitor subunits 21 and 21 are separated from each other by a section 20a which is composed of a portion 26a of the second interlayer insulating layer 26 under the dielectric layer 27, a portion 27a of the dielectric layer 27, a portion 34a of the protective layer 34 formed so as to cover the second electrode layer 31.

Further, as shown in FIG. 4, the respective capacitor subunits 21 are connected to each other in parallel through the connection 41. That is, the first electrode layers 25 are connected to each other through a first connecting section 41a, and the second electrode layers 31 are connected to each other through a second connecting section 41b. The first connecting section 41a is composed of a conductive layer continuous to the first electrode layer 25, and the second connecting section 41b is composed of a conductive layer continuous to the second electrode layer 31.

An opening located on the first electrode layer 25 is formed in the second interlayer insulating layer 26. The opening is formed by etching the second interlayer insulating layer 26, and a method of forming it will be described later. The inner wall of the opening is preferably not vertical to the upper surface of the first electrode layer 25 but it is tapered so that the diameter thereof is gradually increased upward. The dielectric layer 27 having a thickness of about 10 nm to about 100 nm is formed in the opening and on the interlayer insulating layer 26. The dielectric layer 27 is specifically a silicon oxide layer or an ONO layer (layer made by forming an oxide layer, a nitride layer and an oxide layer) or the like.

The capacitor unit 200 according to the embodiment can be made on the same substrate as that of electronic elements such as a MOS transistor and the like using a process also used to manufacture a semiconductor device including the MOS transistor, similar to the first embodiment. That is, the conductive layers constituting the first electrode layer 25 and the second electrode layer 31 can be manufactured using a process also used to form the metal wiring layer of the semiconductor device including the MOS transistor. The first and second electrode layers may be any two metal wiring layers which are adjacent to each other up and down, and it is preferably composed of an uppermost metal wiring layer and a metal wiring layer under it. Similarly, the interlayer insulating layers 22 and 26 and the protective layer (passivation layer) 34 can be formed using a process also used for manufacturing the elements such as the MOS transistor and the like in the same way.

The materials of the respective layers constituting the capacitor unit 200 can be changed in accordance with the processes for manufacturing the other electronic elements such as the MOS transistor and the like. For example, a metal layer of other metal such as steel or the like can be used in place of the aluminum alloy layer.

FIG. 6–FIG. 20 are sectional views schematically showing a third embodiment, which is a method of manufacturing a semiconductor device such as the second embodiment described above.

Figure 6:
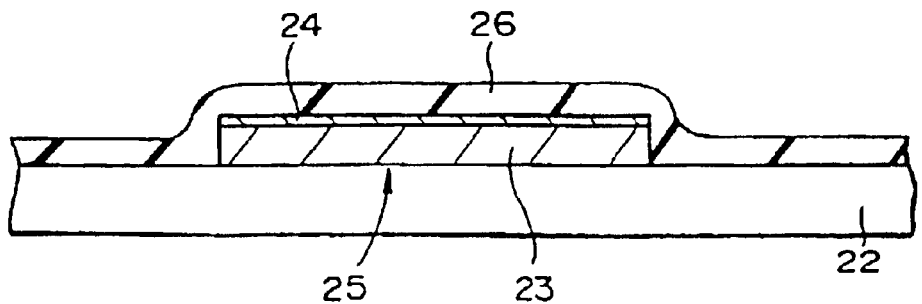
FIG. 6 is a sectional view schematically showing an embodiment of a method of manufacturing a semiconductor device such as the second embodiment of the present invention.

First, a titanium layer having a thickness of about 5 nm to about 50 nm is formed on an interlayer insulating layer 22, and a titanium nitride layer having a thickness of about 10 nm to about 200 nm is formed on the titanium layer. Thereafter, a conductive layer, which has a thickness of about 100 nm to about 1000 nm and is mainly composed of aluminum, for example, an Al—Cu alloy layer or an Al—Si—Cu alloy layer 23, is formed on the titanium nitride layer by sputtering. Next, after a titanium nitride layer 24 having a thickness of about 10 nm to about 100 nm is formed on the conductive layer 23, a first electrode layer 25 is formed on the interlayer insulating layer 22 by patterning the titanium nitride layer 24, the conductive layer 23, the titanium nitride layer and the titanium layer. Next, an interlayer insulating layer 26 having a thickness of about 100 nm to about 1000 nm and composed of a silicon oxide layer such as a TEOS layer or the like is formed on the first electrode layer 25 and the interlayer insulating layer 22 by a CVD method as illustrated in FIG. 6.

Figure 7:
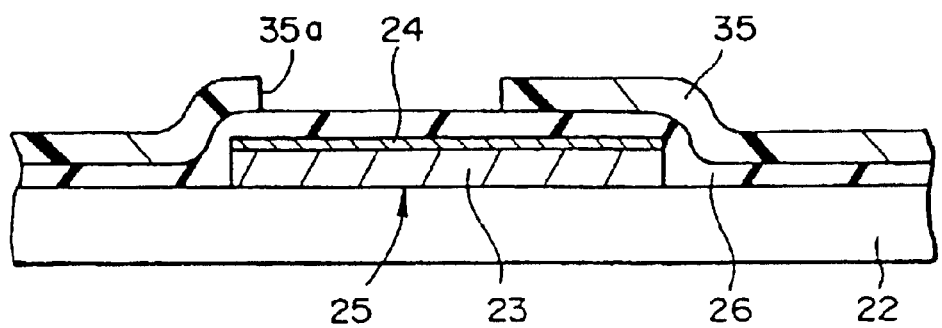
FIG. 7 shows a step in a method of manufacturing a semiconductor device after the step of FIG. 6.

Thereafter, as shown in FIG. 7, an i-line resist layer 35 is formed on the interlayer insulating layer 26, and an opening 35a located above the first electrode layer 25 is formed by exposing and developing the i-line resist layer 35.

Figure 8:
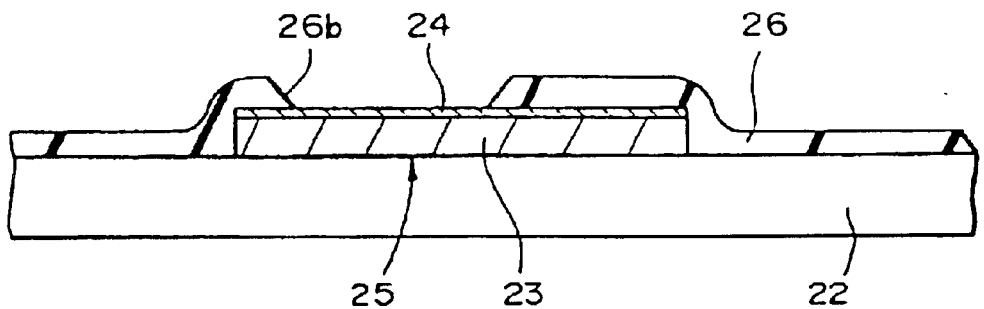
FIG. 8 shows a step in a method of manufacturing a semiconductor device after the step of FIG. 7.

Next, as shown in FIG. 8, an opening 26b located above the first electrode layer 25 is formed in the interlayer insulating layer 26 by wet etching the interlayer insulating layer 26 while using the i-line resist layer 35 as a mask. It is preferable to use an etching solution having the following composition ratio in the above etching:

(HF of 50%):(NH$_4$F of 40%):CH$_3$COH=2:20:10

When the interlayer insulating layer 26 is etched with the above etching solution using the above i-line resist layer 35 as the mask, a taper is formed on the etched surface thereof (inner wall of the opening 26b). Since the i-line resist layer 35 has an excellent intimate contact property with the interlayer insulating layer (SiO$_2$ layer) 26, the taper formed on the opening 26b has a proper angle. Specifically, the angle between the upper surface of the first electrode layer 25 and the inner surface of the opening 26b is preferably set to about 30° to about 60°, as illustrated in FIG. 8.

Figure 9:
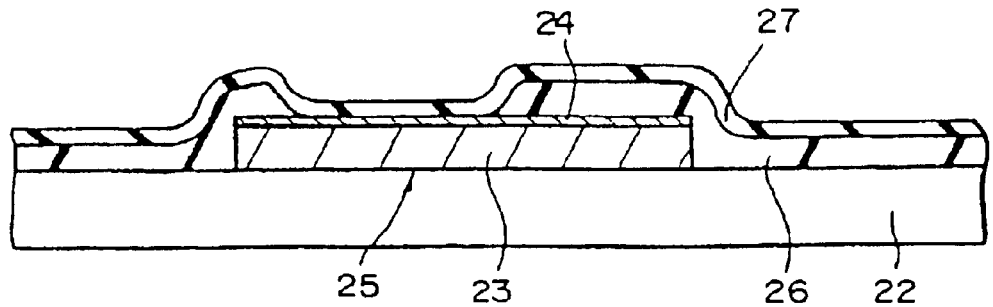
FIG. 9 shows a step in a method of manufacturing a semiconductor device after the step of FIG. 8.

Thereafter, as shown in FIG. 9, a dielectric layer 27 having a thickness of about 80 nm to about 120 nm and composed of SiO$_2$ is formed in the opening 26b and on the interlayer insulating layer 26 by a method such as CVD.

Figure 10:
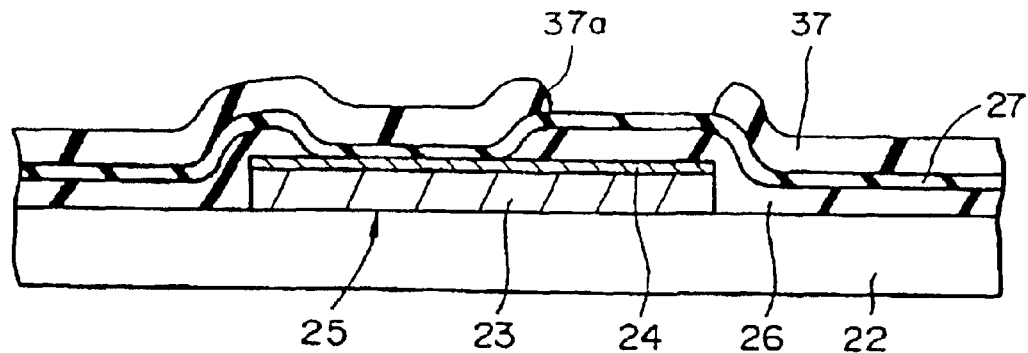
FIG. 10 shows a step in a method of manufacturing a semiconductor device after the step of FIG. 9.

Next, as shown in FIG. 10, a resist layer 37 is applied onto the dielectric layer 27, exposed and developed, whereby an opening 37a located above the first electrode layer 25 is formed in the resist layer 37.

Figure 11:
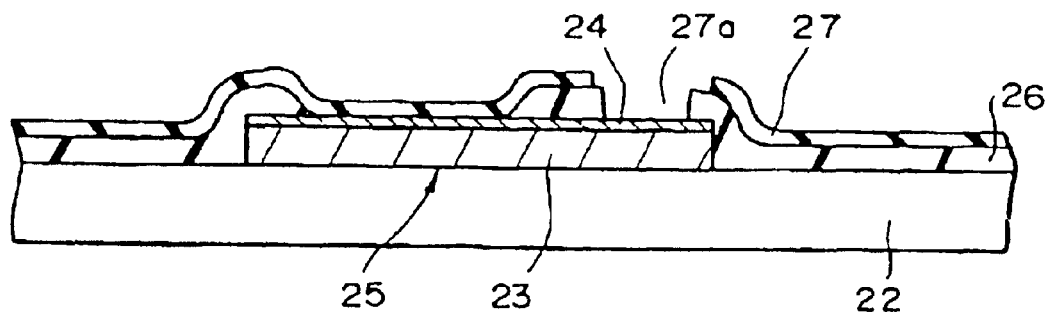
FIG. 11 shows a step in a method of manufacturing a semiconductor device after the step of FIG. 10.

Thereafter, as shown in FIG. 11, an opening 27a located above the first electrode layer 25 is formed by etching the dielectric layer 27 and the interlayer insulating layer 26 using the resist layer 37 as a mask. Next, the resist layer 37 is removed by etching.

Figure 12:
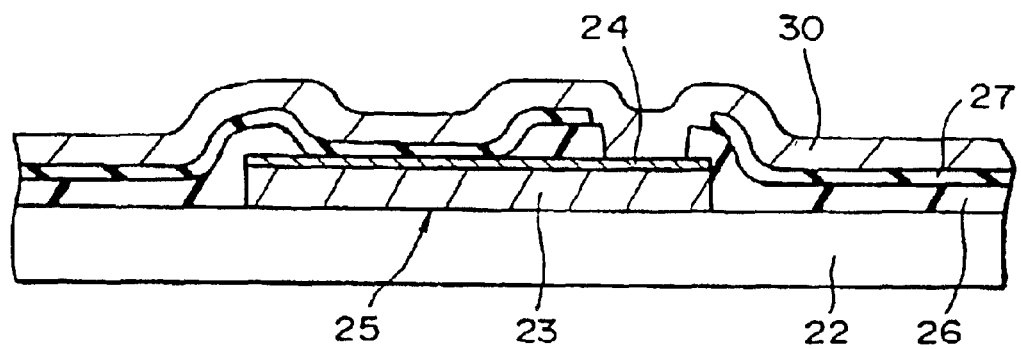
FIG. 12 shows a step in a method of manufacturing a semiconductor device after the step of FIG. 11.

Next, as shown in FIG. 12, a conductive layer 30 having a thickness of about 100 nm to about 1000 nm and preferably composed of an Al—Si—Cu alloy layer or an Al—Cu alloy layer is deposited in the opening 27a and on the dielectric layer 27 by sputtering.

Figure 13:
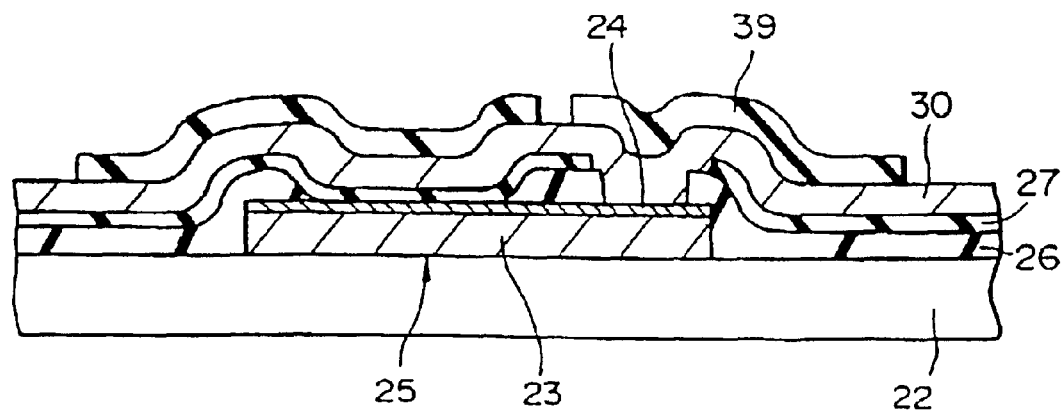
FIG. 13 shows a step in a method of manufacturing a semiconductor device after the step of FIG. 12.

Thereafter, as shown in FIG. 13, a resist layer 39 is formed on the conductive layer 30, exposed and developed.

Figure 14:
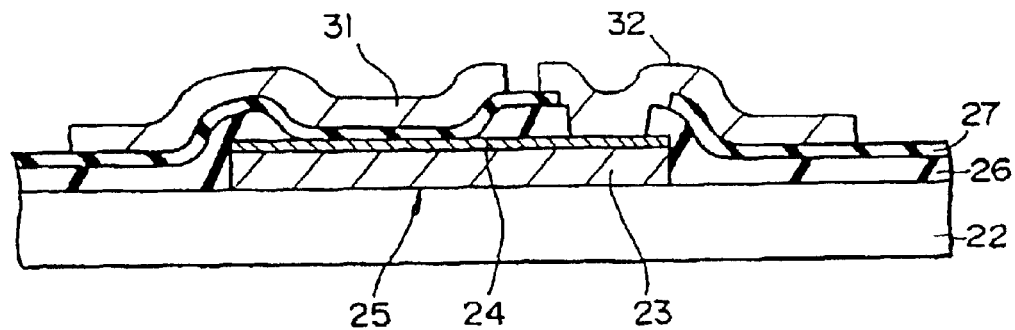
FIG. 14 shows a step in a method of manufacturing a semiconductor device after the step of FIG. 13.

Next, as shown in FIG. 14, a second electrode layer 31 is formed on the first electrode layer 25 through the dielectric layer 27 by etching the conductive layer 30 using the resist layer 39 as a mask, and further an outgoing electrode 32 electrically connected to the first electrode layer 25 is formed.

Figure 15:
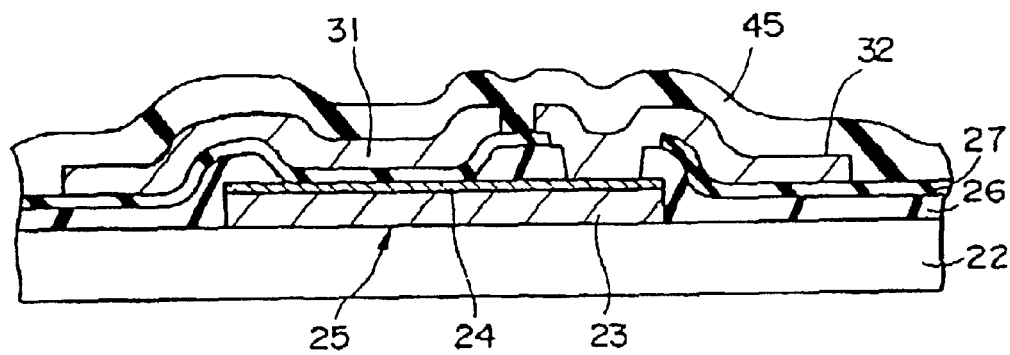
FIG. 15 shows a step in a method of manufacturing a semiconductor device after the step of FIG. 14.
Figure 16:
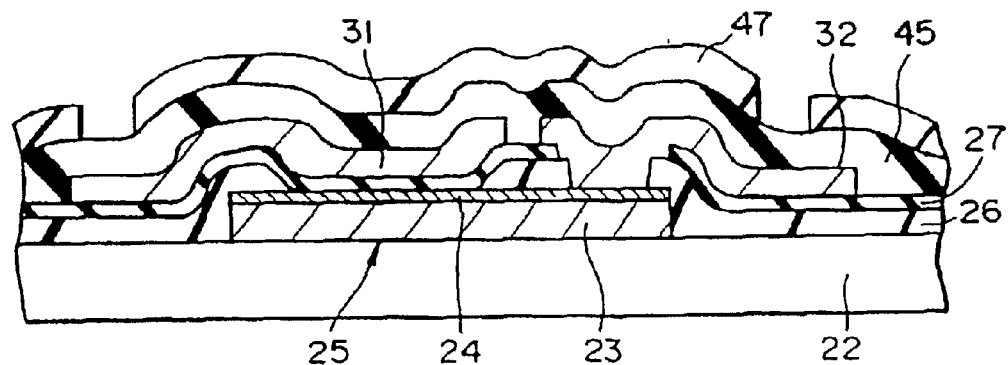
FIG. 16 shows a step in a method of manufacturing a semiconductor device after the step of FIG. 15.

Thereafter, as shown in FIG. 15, a silicon oxide layer 45 may be deposited on the upper surface of a wafer including the second electrode layer 31 and the outgoing electrode 32 by CVD. Next, as shown in FIG. 16, a resist layer 47 is applied onto the silicon oxide layer 45, exposed and developed.

Figure 17:
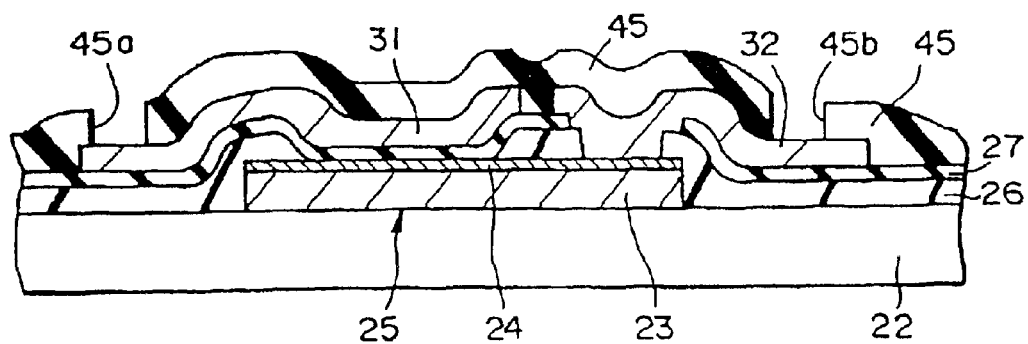
FIG. 17 shows a step in a method of manufacturing a semiconductor device after the step of FIG. 16.

Thereafter, as shown in FIG. 17, the silicon oxide layer 45 is etched using the resist layer 47 as a mask, whereby an opening 45a, which is located on the second electrode layer 31, and an opening 45b, which is located on the outgoing electrode 32, are formed in the silicon oxide layer 45. Next, the resist layer 47 is removed by etching.

Figure 18:
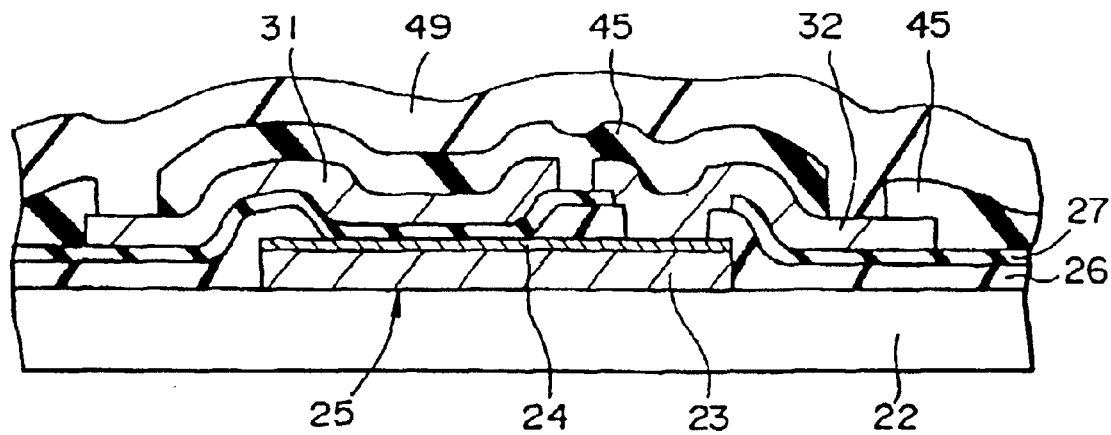
FIG. 18 shows a step in a method of manufacturing a semiconductor device after the step of FIG. 17.
Figure 19:
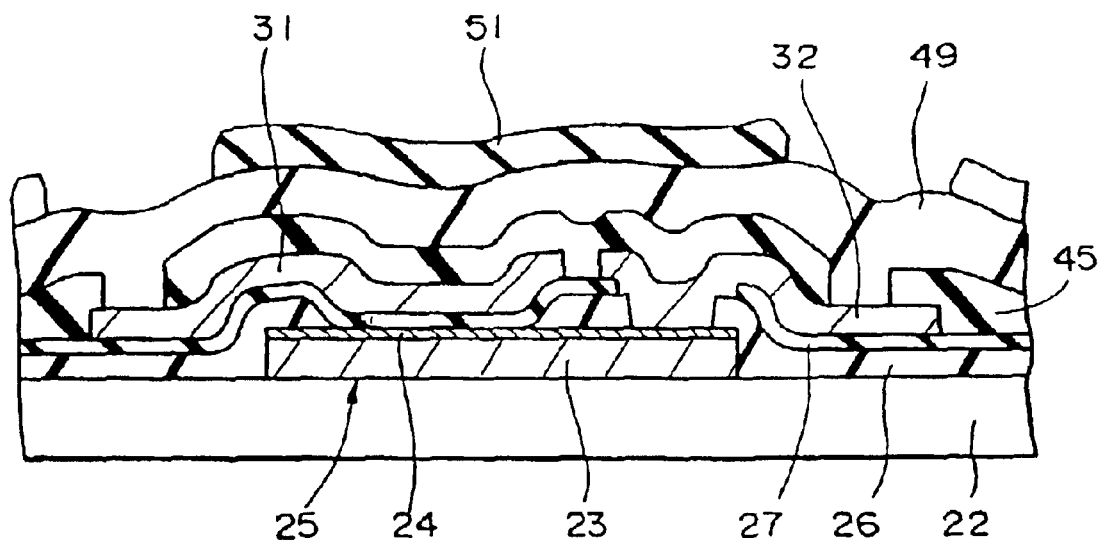
FIG. 19 shows a step in a method of manufacturing a semiconductor device after the step of FIG. 18.

Next, as shown in FIG. 18, it is preferred that a silicon nitride layer 49 is deposited in the openings 45a and 45b and on the silicon oxide layer 45 by the CVD method. Next, as shown in FIG. 19, a resist layer 51 is applied onto the silicon nitride layer 49, exposed and developed.

Figure 20:
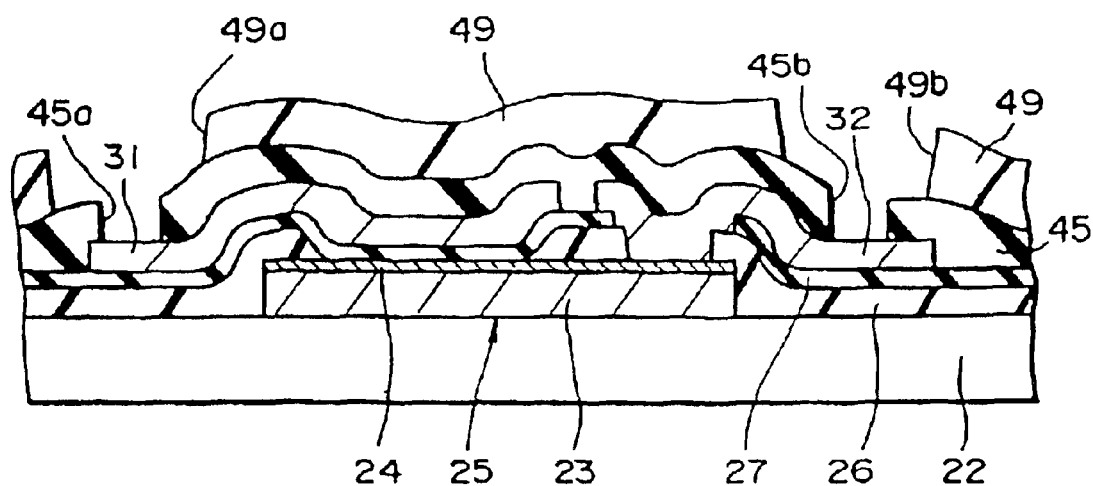
FIG. 20 shows a step in a method of manufacturing a semiconductor device after the step of FIG. 19.

Thereafter, as shown in FIG. 20, the silicon nitride layer 49 is etched using the resist layer 51 as a mask, whereby an outgoing opening 49a for the second electrode layer 31 is formed in the silicon nitride layer 49 at a position including the opening 45a formed on the second electrode layer 31 and an outgoing opening 49b for the first electrode layer 25 is also formed in the silicon nitride layer 49 at a position including the opening 45b formed on the outgoing electrode 32. Next, the resist layer 51 is removed by etching.

In the embodiment, the opening 26b is preferably formed by wet etching the interlayer insulating layer 26 using the i-line resist layer 35 as the mask. However, it is also possible to form the opening 26b by subjecting the interlayer insulating layer 26 to dry etching having a large selection ratio after it is wet etched using the i-line resist layer 35 as the mask, in place of the above method. Further, it is also possible to form the opening 26b by subjecting the interlayer insulating layer 26 to the dry etching having the large selection ratio using the resist layer as a mask.

The second embodiment has the following operation and effect. The capacitor unit 200 is divided into the plurality of capacitor subunits 21 having the predetermined pattern by the continuous separating insulation layer 20, similar to the first embodiment. Then, the separating insulation layer 20 is composed of the plurality of silicon oxide layers formed in the film thickness direction of the silicon substrate. Specifically, the separating insulation layer 20 is composed of the second interlayer insulating layer 26, the dielectric layer 27 and the protective layer 34. Therefore, as shown in FIG. 1, the respective capacitor subunits 21 have such a structure that the peripheries thereof are surrounded by the separating insulation layer 20 comprising the continuous silicon oxide layer. Since the separating insulation layer 20 is, generally, a solid layer composed of the silicon oxide layer, the mechanical strength of the capacitor unit 200 can be increased by the separating insulation layer 20, and the external force acting on the capacitor subunits 21 can be eased.

Since the mechanical strength of the capacitor unit 200 can be increased by the presence of the separating insulation layer 20, the semiconductor device according to the second embodiment is particularly effective when it is packaged as a pair of chips such as, for example, COB, COG, COF, TCB, TAB and the like. That is, in the packaging method of semiconductor chips, pressure acts on them because they are joined to a board or a substrate by crimping. Thus, the elements in the semiconductor chips are subjected to stress. The stress is liable to cause a problem such as distortion and the like in metal layers (first and second electrode layers 25 and 31) of, in particular, aluminum alloy and the like. Then, this problem is generally more significant when an element has a larger area.

However, according to the semiconductor device of the second embodiment, since the stress applied to the capacitor subunits 21 is eased by the separating insulation layer 20, the capacitor subunits 21 can be reliably prevented from being broken by the stress even if the capacitor unit 200 has a large area.

According to the semiconductor device of the second embodiment, since the taper is provided with the opening of the interlayer insulating layer 26 interposed between the first electrode layer 25 and the second electrode layer 31, the deterioration of step coverage can be suppressed when the dielectric layer 27 is formed in the opening. Therefore, a short circuit between the second electrode layer 31 and the first electrode layer 25 in the opening of the interlayer insulating layer 26 can be reliably inhibited.

Further, in the second embodiment, when the opening 26b is formed in the interlayer insulating layer 26, the titanium nitride layer 24 preferably remains without being etched. Accordingly, the surface of the first electrode layer 25 can be made flat with less irregularities, whereby the defects such as pinholes and the like can be reduced on the surface of the first electrode layer and the film quality of the dielectric layer 27 can be improved. As a result, the capacitor unit having high reliability can be formed.

In a case when the titanium nitride layer 24 is also removed by etching in the formation of the opening 26b, the irregularities, which originally exist on the surface of the aluminum alloy layer 23 formed by sputtering, are made more notable. The irregularities affect the film quality of the dielectric layer, increase the number of defects of the dielectric layer and cause the variation of the film thickness of the dielectric layer. As a result, problems are liable to be caused in that a yield is reduced and reliability is lowered in the manufacture of a semiconductor device. In the second embodiment, however, these problems can be solved by the provision of the above structure. Further, the structure not only can reduce the defects discovered in a short period of time but also can reduce the defects which arise over a long period of time (defects discovered in a reliability test).

In the semiconductor device of the second embodiment, since the capacitor unit 200 may be formed by modifying a known process used for forming a MOS transistor to form the layers of the capacitor unit 200 at the same time as layers of the MOS transistor, similar to the first embodiment, the capacitor unit 200 can be formed on a silicon substrate similar to that of other semiconductor devices such as a logic circuit and the like. When the capacitor unit 200 and other semiconductor devices are mounted on the same substrate, the semiconductor device of the embodiment is advantageous in a packaging cost, a reduced occupying area and the like.

Further, since the semiconductor device of the second embodiment can be manufactured using a process also used to form other semiconductor devices such as the logic circuit and the like, it can be easily manufactured.

While the preferable embodiments of the present invention have been described above, the present invention is by no means limited thereto and various aspects can be employed within the gist of the present invention.

For example, while the separating insulation layer may have the continuous grid-shaped plane pattern described above, the present invention is not limited thereto, and the separating insulation layer may have another plane pattern, for example, a plane pattern by which the plane pattern of the capacitor subunits is made to a shape other than a square shape, such as, for example, a rectangular shape or a hexagonal shape.

Further, while the separating insulation layer is formed continuously as described above, it need not be formed continuously so long as the mechanical strength of the unit capacitance units can be secured thereby.

What is claimed:

1. A semiconductor device, comprising:
   a capacitor unit formed on a semiconductor substrate,
   wherein said capacitor unit is divided into a plurality of capacitor subunits which are separated from each other by a separating layer, and
   each of said capacitor subunits comprises a first electrode layer, a second electrode layer, and a dielectric layer interposed between said first electrode layer and said second electrode layer.

2. A semiconductor device according to claim 1, wherein each of said capacitor subunits comprises:
   a first electrode layer comprising an impurity diffusion layer formed on said semiconductor substrate;
   a dielectric layer formed on said first electrode layer; and
   a second electrode layer formed on said dielectric layer and comprising a conductive silicon layer.

3. A semiconductor device according to claim 2, wherein:
   said dielectric layer comprises a silicon oxide layer formed by a process also used to form a gate insulating layer of a MOS transistor; and
   said second electrode layer comprises a conductive silicon layer formed by a process also used to form a gate electrode of said MOS transistor.

4. A semiconductor device according to claim 2, wherein said separating layer for partitioning said capacitor subunits comprises at least a silicon oxide layer formed by a process that is also used to form an element separating region.

5. A semiconductor device according to claim 2, wherein at least one shading layer is further formed above said second electrode layer.

6. A semiconductor device according to claim 5, wherein said shading layer comprises a metal layer formed by a process that is also used to form a metal wiring layer.

7. A semiconductor device according to claim 1, wherein each of said capacitor subunits comprises:
   a first electrode layer comprising a metal layer formed above said semiconductor substrate;
   a dielectric layer formed on said first electrode layer; and
   a second electrode layer comprising a metal layer formed on said dielectric layer.

8. A semiconductor device according to claim 7, wherein:
   said first electrode layer comprises a metal layer formed by a process that is also used to form a first metal wiring layer; and
   said second electrode layer comprises a metal layer formed by a process that is also used to form a second metal wiring layer.

9. A semiconductor device according to claim 7, wherein said separating layer for partitioning said capacitor subunits comprises at least an interlayer insulating layer interposed between said first electrode layer and said second electrode layer.

10. A semiconductor device according to claim 7, wherein said dielectric layer is disposed along the surface of an opening formed in said interlayer insulating layer on said first electrode layer, and said opening is formed such that the side thereof is made to a taper shape with the diameter thereof being gradually increased toward said second electrode layer.

11. A semiconductor device according to claim 1, wherein said capacitor subunits are connected to each other in parallel, respectively.

12. A semiconductor device, wherein said capacitor unit according to claim 1 and other circuit elements including at least a MOS transistor are mounted on said semiconductor substrate.

13. A semiconductor device comprising:
   a plurality of capacitor subunits on a substrate, said subunits each comprising a first electrode, a dielectric, and a second electrode;
   a separation layer between said subunits, said separation layer including a first interlayer insulating layer, a dielectric layer, and a protective layer.

14. A semiconductor device as in claim 13, wherein said first interlayer insulating layer extends over a portion of said first electrode and includes at least one sidewall over said first electrode, said sidewall having an angle of about 30° to about 60° with respect to an upper surface of said first electrode.

15. A semiconductor device as in claim 14, wherein a portion of said dielectric is positioned directly over said sidewall and a portion of said second electrode is positioned directly over said portion of said dielectric.

* * * * *